United States Patent [19]

Tatsuoka et al.

[11] Patent Number: 4,819,327
[45] Date of Patent: Apr. 11, 1989

[54] SOLDERING METHOD FOR PRINTED CIRCUIT BOARD

[75] Inventors: Syuuzi Tatsuoka, Katsuta; Hiroshi Sekiyama, Hadano; Kanji Ishige, Ashigarakamigun, all of Japan

[73] Assignee: Hitachi, Ltd., Tokyo, Japan

[21] Appl. No.: 17,532

[22] Filed: Feb. 24, 1987

[30] Foreign Application Priority Data

Feb. 26, 1986 [JP] Japan .................................. 61-40784

[51] Int. Cl.⁴ .............................................. A05K 3/34
[52] U.S. Cl. .................................. 29/840; 228/180.2; 228/256
[58] Field of Search ............... 29/840; 228/180.2, 256, 228/259

[56] References Cited

FOREIGN PATENT DOCUMENTS 60-42597 7/1985 Japan .
261666 12/1985 Japan ..................................... 228/256

Primary Examiner—Carl J. Arbes
Attorney, Agent, or Firm—Antonelli, Terry & Wands

[57] ABSTRACT

This invention relates to a method of soldering electronic components for a printed circuit board by dipping the printed circuit board into a molten solder inside a soldering bath. When the printed circuit board is dipped into the molten solder inside the soldering bath, it is dipped together with a member that attracts the molten solder, and when the printed circuit board is pulled up from the molten solder, it is pulled up while the edge of the member keeps contact with a solder connection portion of the printed circuit board. After the printed circuit board is pulled from the molten solder, the edge of the member is separated from the printed circuit board to remove any excessive solder adhering to the connection portion by the surface tension of the solder.

12 Claims, 1 Drawing Sheet

SOLDERING METHOD FOR PRINTED CIRCUIT BOARD

BACKGROUND OF THE INVENTION

This invention relates generally to soldering of electronic components onto a printed circuit board, and more particularly to a soldering method of a printed circuit board having mounted thereto high density electronic components with narrow lead gaps.

When electronic components are soldered to a printed circuit board, excessive solder and solder bridge become serious problems particularly in high density electronic components. The following two methods have been known in the past as the methods of removing the excessive solder and solder bridge that occur when soldering. The first method directly puts a soldering iron to a solder portion and absorbs any unnecessary solder, and the second method absorbs the unnecessary solder by capillary action using a twisted copper wire impregnated with a specific flux (such as "Solder Wick", a product of C.S.C. Co., Ltd.).

Since the conventional methods described above are in a sense the countermeasures for the excessive solder and the solder bride that have already been formed, they do not naturally contemplate at all how to prevent the formation itself of the excessive solder and the solder bridge, and are not free from the following problems.

(a) When the solder is built up excessively on the twisted wire, the wire does not absorb the solder any more and hence, must be discarded.

(b) Whether or not soldering has been made satisfactorily must be confirmed with the eye when using a soldering iron or a solder absorbing wire. Accordingly, if the soldering iron or the wire is put to the solder portion that has been made completely, the solder at that portion will become insufficient.

(c) An apparatus for automatically checking the soldered state is so expensive that an apparatus for automatically absorbing and removing the excessive solder becomes expensive as a whole.

SUMMARY OF THE INVENTION

In order to eliminate the problems of the prior art techniques described above, the present invention provides a soldering method which prevents the formation of an excessive solder when soldering a printed circuit board.

In accordance with the present invention, a soldering method of a printed circuit board is characterized in that a member which attracts a molten solder is dipped together with a printed circuit board when the printed circuit board is dipped into the molten solder of a soldering bath, the printed circuit board is pulled out from the bath while the edge of the member is in contact with a solder connection portion of the printed circuit board, and after the printed circuit board is pulled completely from the molten solder, the edge of this member is separated from the printed circuit board. When the solder absorbing member is separated from the printed circuit board, the excessive solder adhering to the connection portion is removed due to surface tension.

DESCRIPTION OF THE PREFERRED EMBODIMENTS

Hereinafter, a preferred embodiment of the present invention will be described with reference to the accompanying drawings.

Figure 1:
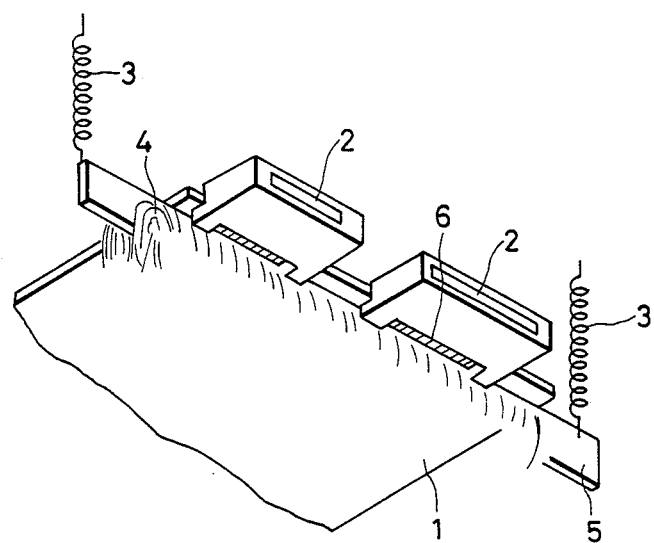
FIG. 1 is a perspective view of a printed circuit board and a connector when they are soldered and viewed from the bottom.

FIG. 1 is a perspective view of a substrate 1 and a connector 2, as viewed from the bottom, when they are soldered. The connector 2 is caulked to the substrate 1. Reference numeral 4 denotes a solder surface inside a soldering bath, and 5 denotes an elongated sheet-like solder absorbing member which is made of a 42 alloy. Reference numeral 3 denotes a spring which suspends the solder absorbing member 5. While the solder absorbing member 5 is supported by the spring 3 and is stably at rest above the solder surface 4, the substrate 1 with the connector 2 fitted thereto is lowered. When the substrate 1 comes into contact with the edge of the solder absorbing member 5 at solder connection portions near and between the substrate 1 and connector leads 6, the substrate 1 keeps descending in such a manner as to push the solder absorbing member 5 against the righting moment of the spring 3, and is then dipped into the solder surface 4 and soldered. Thereafter, the substrate 1 is raised gradually while keeping contact with the edge of the solder absorbing member 5, is pulled completely above the solder surface and keeps rising. Though the solder absorbing member 5 follows the ascension of the substrate 1 for a while, it cannot follow the substrate 1, after it returns to the original stop position due to the righting moment of the spring 3 and is thus separated from the substrate 1. At this time, the excessive molten solder between the substrate 1 and the connector leads 6 leave the gap between substrate 1 and the connector leads 6 through the solder absorbing member 5 due to surface tension, and flows toward the solder surface 4. Accordingly, the excessive solder or the solder bridge that would otherwise occur between the substrate 1 and the connector leads 6 can be eliminated.

Figure 2A:
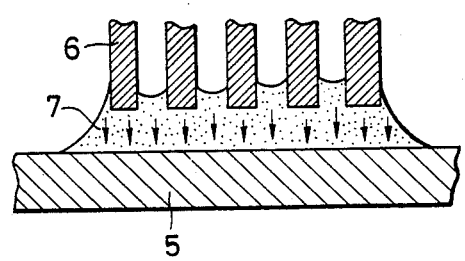
FIGS. 2(a) and 2(b) are sectional views showing the principle of the present invention.
Figure 2B:
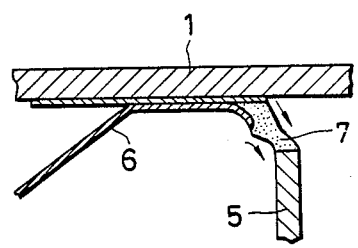

FIGS. 2(a) and 2(b) and sectional views that show the principal of the present invention. The connector leads 6 and the solder absorbing member 5 mutually attract the excessive solder 7 between them, and the excessive solder 7 adhering to the connector leads 6 is returned to the soldering bath through the solder absorbing member 5 due to the surface tension. Accordingly, the solder bridge and the excessive solder on the surface of the connector leads 6 is removed.

Incidentally, any materials may be used as the solder absorbing member 5 so long as they are heat resistant to the molten solder, do not permit easy adherence of solder thereto and do not contaminate the solder. Preferably, the solder absorbing member 5 has a thinly elongated flat sheet-like shape. The thickness of such a sheet is substantially equal to the width of the solder connection portion and its length is at least the length of the solder connection portion of the substrate 1. If the edge of the solder absorbing member 5 is rounded, the solder can be separated sharply.

In the embodiment of the invention described above, the solder absorbing member 5 is suspended by the spring 3, but any other mechanism can of course be employed so long as they can let the solder absorbing member 5 follow the substrate 1 while keeping contact therewith for a while after the substrate 1 is pulled from the solder surface 4, and then separate the solder absorbing member 5 from the substrate 1.

The present invention can eliminate completely the excessive solder and the solder bridge during the soldering work and any correction work after soldering. Accordingly, the present invention can be applied to an automatic apparatus.

What is claimed is:

1. A soldering method of a printed circuit board by dipping said printed circuit board into a molten solder inside a soldering bath, said soldering method characterized in that a member equipped at the edge thereof with the width substantially equal to and the length at least equal to those of a solder connection portion of said printed circuit board is dipped into said molten solder together with said printed circuit board when said printed circuit board is dipped into said molten solder, said printed circuit board is pulled up from said molten solder while the edge of said member keeps contact with said solder connection portion when said printed circuit board is pulled up from said molten solder, and the edge of said member is separated from said connection portion after said printed circuit board and said member are pulled out from said molten solder in order to remove part of the solder adhering to said connection portion by surface tension.

2. A soldering method for a printed circuit board by dipping said printed circuit board into a molten solder inside a soldering bath, said soldering method characterized in that a member equipped at the edge thereof with the width substantially equal to and the length at least equal to those of a solder connection portion of said printed circuit board is dipped into said molten solder together with said printed circuit board when said printed circuit board is dipped into said molten solder, said printed circuit board is pulled up from said molten solder while the edge of said member keeps contact with said solder connection portion when said printed circuit board is pulled up from said molten solder, and the edge of said member is separated from said connection portion after said printed circuit board and said member are pulled out from said molten solder in order to remove part of the solder adhering to said connection portion by surface tension, wherein said member is suspended by a spring, is pushed down and dipped into said molten solder by said printed circuit board against a righting moment of said spring, is returned to an original stop position by the righting moment of said spring after said member is pulled from said molten solder, and is separated from said printed circuit board.

3. The soldering method for a printed circuit board as defined in claim 1, wherein said member is a thin elongated flat sheet.

4. A soldering method for a printed circuit board by dipping said printed circuit board into a molten solder inside a soldering bath, said soldering method characterized in that a member equipped at the edge thereof with the width substantially equal to and the length at least equal to those of a solder connection portion of said printed circuit board is dipped into said molten solder together with said printed circuit board when said printed circuit board is dipped into said molten solder, said printed circuit board is pulled up from said molten solder while the edge of said member keeps contact with said solder connection portion when said printed circuit board is pulled up from said molten solder, and the edge of said member is separated from said connection portion after said printed circuit board and said member are pulled out from said molten solder in order to remove part of the solder adhering to said connection portion by surface tension, wherein said solder connection portion is located at a position where connector leads are in contact with said printed circuit board.

5. A soldering method for a printed circuit board by dipping said printed circuit board into a molten solder inside a solder bath, the steps comprising:
   dipping a member which is equipped at an edge thereof with a width substantially equal to and a length at least equal to those of a solder connection portion of said printed circuit board into said molten solder together with said printed circuit board;
   pulling up said printed circuit board from said molten solder while keeping the edge of said member in contact with said solder connection portion; and
   separating the edge of said member from said connection portion after said solder connection portion has been pulled out of the molten solder so that a part of the molten solder adhered to said connection portion may be removed by dripping off the solder through said member.

6. A soldering method for a printed circuit board by dipping said printed circuit board into a molten solder inside a solder bath, the steps comprising:
   dipping a member which is equipped at an edge thereof with a width substantially equal to and a length at least equal to those of a solder connection portion of said printed circuit board into said molten solder together with said printed circuit board;
   pulling up said printed circuit board from said molten solder while keeping the edge of said member in contact with said solder connection portion; and
   separating the edge of said member from said connection portion after said solder connection portion has been pulled out of the molten solder so that a part of the molten solder adhered to said connection portion may be removed by dripping off the solder through said member;
   wherein said dipping step comprises pushing down said member which is suspended by springs by said printed circuit board driven down into said molten solder against the righting moment of said springs; and
   the separating step comprises lifting said printed circuit board until said member has returned to the original position due to the righting moment of said springs and then has been separated from said solder connection portion.

7. The soldering method according to claim 5, wherein said member is an elongated flat sheet in shape.

8. A soldering method for a printed circuit board by dipping said printed circuit board into a molten solder inside a solder bath, the steps comprising:
   dipping a member which is equipped at an edge thereof with a width substantially equal to and a length at least equal to those of a solder connection portion of said printed circuit board into said molten solder together with said printed circuit board;

pulling up said printed circuit board from said molten solder while keeping the edge of said member in contact with said solder connection portion; and separating the edge of said member from said connection portion after said solder connection portion has been pulled out of the molten solder so that a part of the molten solder adhered to said connection portion may be removed by dripping off the solder through said member;

wherein said solder connection portion is a portion where the leads of a connector are connected to said printed circuit board.

9. A soldering method for a printed circuit board comprising the steps of:

providing a soldering bath of a molten solder;

providing a printed circuit board having a solder connection portion to be soldered;

suspending a solder absorbing member above said soldering bath, wherein said member has a thickness substantially equal to said solder connection portion of said printed circuit board and has a length at least equal to a length of said solder connection portion;

dipping said member and said printed circuit board simultaneously into said soldering bath while said member is in contact with said solder connection portion;

pulling said printed circuit board from said soldering bath while said member remains in contact with said solder connection portion; and separating said member from said solder connection portion after said printed circuit board is pulled completely from said soldering bath, such that a portion of solder adhering to said solder connection portion is removed by surface tension.

10. A soldering method for a printed circuit board comprising the steps of:

providing a soldering bath of a molten solder;

providing a printed circuit board having a solder connection portion to be soldered;

suspending a solder absorbing member above said soldering bath, wherein said member has a thickness substantially equal to said solder connection portion of said printed circuit board and has a length at least equal to a length of said solder connection portion;

dipping said member and said printed circuit board simultaneously into said soldering bath while said member is in contact with said solder connection portion;

pulling said printed circuit board from said soldering bath while said member remains in contact with said solder connection portion; and separating said member from said solder connection portion after said printed circuit board is pulled completely from said soldering bath, such that a portion of solder adhering to said solder connection portion is removed by surface tension;

wherein said member is suspended by means of springs, said dipping step includes pushing said member down into said soldering bath against a righting moment of said spring using said printed circuit board; and said separating step includes lifting said printed circuit board until said member returns to its original suspended position by means of the righting moment of said springs, and separating said printed circuit board from said member.

11. A soldering method according to claim 9, wherein said member is a thin elongated flat sheet.

12. A soldering method for a printed circuit board comprising the steps of:

providing a soldering bath of a molten solder;

providing a printed circuit board having a solder connection portion to be soldered;

suspending a solder absorbing member above said soldering bath, wherein said member has a thickness substantially equal to said solder connection portion of said printed circuit board and has a length at least equal to a length of said solder connection portion;

dipping said member and said printed circuit board simultaneously into said soldering bath while said member is in contact with said solder connection portion;

pulling said printed circuit board from said soldering bath while said member remains in contact with said solder connection portion; and separating said member from said solder connection portion after said printed circuit board is pulled completely from said soldering bath, such that a portion of solder adhering to said solder connection portion is removed by surface tension;

wherein said solder connection portion is located at a position where connector leads are in contact with said printed circuit board.

* * * * *